US009425073B2

(12) United States Patent
Onodera et al.

(10) Patent No.: US 9,425,073 B2
(45) Date of Patent: Aug. 23, 2016

(54) DEPRESSION FILLING METHOD AND PROCESSING APPARATUS

(71) Applicant: TOKYO ELECTRON LIMITED, Tokyo (JP)

(72) Inventors: Satoshi Onodera, Nirasaki (JP); Daisuke Suzuki, Nirasaki (JP); Akinobu Kakimoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/464,736

(22) Filed: Aug. 21, 2014

(65) Prior Publication Data
US 2015/0056791 A1 Feb. 26, 2015

(30) Foreign Application Priority Data
Aug. 22, 2013 (JP) ................. 2013-172430

(51) Int. Cl.
*H01L 21/67* (2006.01)
*H01L 21/02* (2006.01)
*C23C 16/24* (2006.01)
*C30B 29/06* (2006.01)
*C23C 16/455* (2006.01)
*C23C 16/56* (2006.01)
*C30B 19/00* (2006.01)

(52) U.S. Cl.
CPC .......... *H01L 21/67069* (2013.01); *C23C 16/24* (2013.01); *C23C 16/45589* (2013.01); *C23C 16/56* (2013.01); *C30B 29/06* (2013.01); *H01L 21/0243* (2013.01); *H01L 21/0262* (2013.01); *H01L 21/02532* (2013.01); *H01L 21/02576* (2013.01); *H01L 21/02579* (2013.01); *H01L 21/02592* (2013.01); *H01L 21/02658* (2013.01); *C30B 19/00* (2013.01)

(58) Field of Classification Search
None
See application file for complete search history.

(56) References Cited

U.S. PATENT DOCUMENTS

| 4,565,584 A * | 1/1986 | Tamura et al. ............. 117/8 |
| 4,578,143 A * | 3/1986 | Arai ....................... 117/45 |
| 5,369,280 A * | 11/1994 | Liddiard ................ 250/370.08 |
| 5,888,876 A | 3/1999 | Shiozawa et al. |

(Continued)

FOREIGN PATENT DOCUMENTS

| JP | 10-056154 A | 2/1998 |
| JP | 2000-150830 A | 5/2000 |

(Continued)

OTHER PUBLICATIONS

Quirk et al., "Semiconductor Manufacturing Technology," 2001, Prentice-Hall, Inc., pp. 87-88.*

*Primary Examiner* — Kimberly Rizkallah
*Assistant Examiner* — Bo Bin Jang
(74) *Attorney, Agent, or Firm* — Nath, Goldberg & Meyer; Jerald L. Meyer

(57) ABSTRACT

A depression filling method for filling a depression of a workpiece including a semiconductor substrate and an insulating film formed on the semiconductor substrate is provided. The depression penetrating the insulating film is configured so as to extend to the semiconductor substrate. The method includes: forming a thin film of a semiconductor material along a wall surface that defines the depression; annealing the workpiece to cause the semiconductor material of the thin film to move toward a bottom of the depression and to form an epitaxial region corresponding to crystals of the semiconductor substrate; and etching the thin film.

6 Claims, 4 Drawing Sheets

(56) References Cited

U.S. PATENT DOCUMENTS

| | | | | |
|---|---|---|---|---|
| 6,069,053 A | * | 5/2000 | Ping et al. | 438/398 |
| 6,180,480 B1 | | 1/2001 | Economikos et al. | |
| 6,552,380 B1 | | 4/2003 | Sato et al. | |
| 2005/0136693 A1 | * | 6/2005 | Hasebe et al. | 438/791 |
| 2006/0048702 A1 | * | 3/2006 | Son | C30B 1/023 117/94 |
| 2007/0022941 A1 | * | 2/2007 | Park et al. | 117/3 |
| 2012/0103518 A1 | * | 5/2012 | Kakimoto et al. | 156/345.1 |
| 2013/0170784 A1 | * | 7/2013 | Kim et al. | 385/3 |

FOREIGN PATENT DOCUMENTS

| | | |
|---|---|---|
| JP | 2004-179451 A | 6/2004 |
| JP | 2006-319232 A | 11/2006 |

* cited by examiner

DEPRESSION FILLING METHOD AND PROCESSING APPARATUS

CROSS-REFERENCE TO RELATED APPLICATION

This application claims the benefit of Japanese Patent Application No. 2013-172430, filed on Aug. 22, 2013, in the Japan Patent Office, the disclosure of which is incorporated herein in its entirety by reference.

TECHNICAL FIELD

The present disclosure relates to a depression filling method and a processing apparatus.

BACKGROUND

In the manufacture of a device such as a semiconductor device or the like, a process of filling silicon into a depression such as a through-hole or a contact hole formed on an insulating film is performed. The silicon filled into the depression can be used as, e.g., an electrode.

In a process of the related art, a polycrystalline silicon film is formed on a wall surface of a workpiece, which defines a trench. Subsequently, an amorphous silicon film is formed on the polycrystalline silicon film. Thereafter, the workpiece is annealed. In this process, by annealing the workpiece, amorphous silicon is moved toward the bottom portion of the trench, whereby the trench is filled with the amorphous silicon.

However, in the process mentioned above, when the amorphous silicon is moved toward the bottom portion of the trench by annealing, the amorphous silicon agglomerates. As a result, cavities called voids or seams are formed.

Under these conditions, there is a need to suppress the generation of cavities when filling a depression.

SUMMARY

According to an aspect of the present disclosure, a depression filling method for filling a depression of a workpiece including a semiconductor substrate and an insulating film formed on the semiconductor substrate is provided. The depression penetrating the insulating film is configured so as to extend to the semiconductor substrate. The depression filling method includes: forming a thin film of a semiconductor material along a wall surface that defines the depression; annealing the workpiece to cause the semiconductor material of the thin film to move toward a bottom of the depression and to form an epitaxial region corresponding to crystals of the semiconductor substrate; and etching the thin film.

According to another aspect of the present disclosure, provided is a processing apparatus. The processing apparatus includes: a vessel; a gas supply unit configured to supply a first gas for forming a thin film of a semiconductor material and a second gas for etching the thin film into the vessel; a heating unit configured to heat an internal space of the vessel; and a control unit configured to control the gas supply unit and the heating unit. The control unit configured to execute: a first control operation for controlling the gas supply unit so as to supply the first gas into the vessel and for controlling the heating unit so as to heat the internal space of the vessel; after execution of the first control operation, a second control operation for controlling the heating unit so as to heat the internal space of the vessel; and, after execution of the second control operation, a third control operation for controlling the gas supply unit so as to supply the second gas into the vessel.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Various embodiments will now be described in detail with reference to the accompanying drawings. Throughout the drawings, identical or equivalent parts will be designated by like reference symbols. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
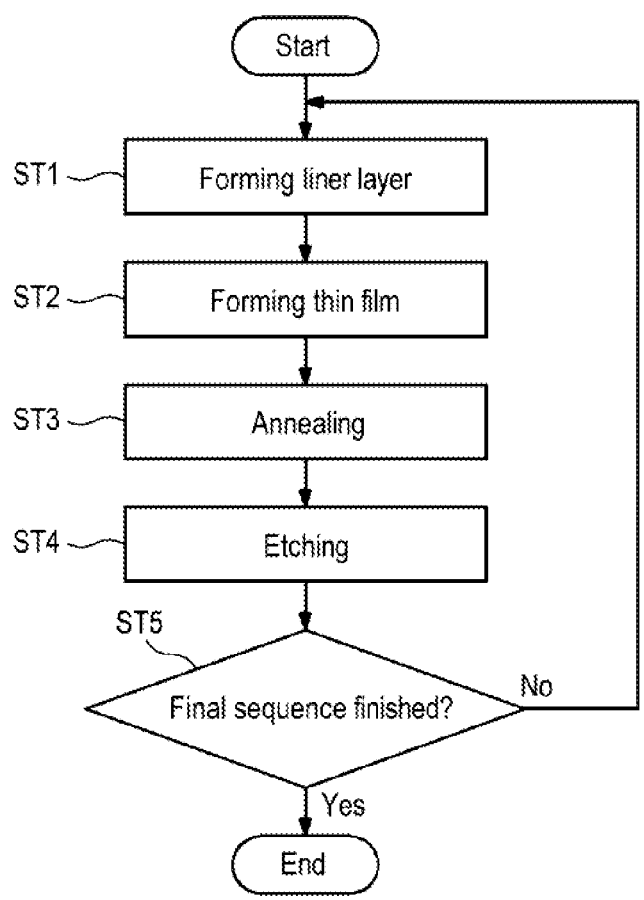
FIG. 1 is a flowchart illustrating a depression filling process according to an embodiment.

FIG. 1 is a flowchart illustrating a depression filling process, according to some embodiments. In the process illustrated in FIG. 1, a semiconductor material is caused to flow into a depression of a workpiece, thereby forming an epitaxial region on the bottom of the depression and wholly or partially filling the depression.

Figure 2A:
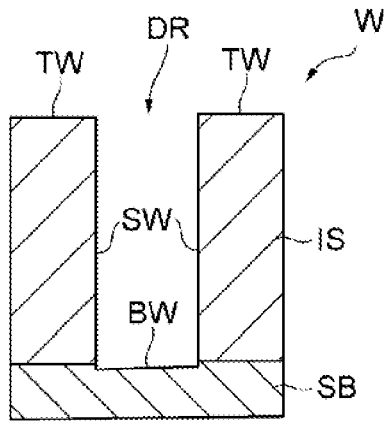
FIGS. 2A to 2F are views illustrating the states of a workpiece that has been subjected to respective steps of the process illustrated in FIG. 1.

FIGS. 2A to 2F are views illustrating the states of a workpiece that has been subjected to the respective steps of the process illustrated in FIG. 1. In FIGS. 2A to 2F, partially-enlarged sectional views of a workpiece are shown. In the process illustrated in FIG. 1, an amorphous silicon flows into a trench of a workpiece, thereby filling the bottom portion of the trench with the amorphous silicon. As shown in FIG. 2A, a workpiece (hereinafter referred to as a "wafer") W includes a substrate SB and an insulating film IS. The substrate SB may be a monocrystalline semiconductor substrate or a polycrystalline semiconductor substrate, e.g., a monocrystalline silicon substrate or a polycrystalline silicon substrate. The insulating film IS is formed on the substrate SB. The insulating film IS may be formed of, e.g., $SiO_2$ or SiN. A depression DR such as a trench or a through-hole is formed in the insulating film IS so as to extend to the substrate SB through the insulating film IS. The depression DR can be formed by, e.g., forming a mask on the insulating film IS and etching the insulating film IS. In some embodiments, the depression DR is formed by piercing the insulating film IS and engraving the substrate SB in a depth direction beyond an interface of the substrate SB and the insulating film IS. This makes it possible to expose an uncontaminated surface of the substrate SB to the depression DR. The depression DR may have a depth of, e.g., 200 nm, and a width of, e.g., 40 to 50 nm.

In the process of FIG. 1, steps ST2, ST3 and ST4 are carried out with respect to the wafer W. Further, according to the process of FIG. 1, a sequence including steps ST2, ST3 and ST4 is repeated. Step ST2 is to form a semiconductor material thin film along a wall surface that defines the depression DR of the wafer W. Step ST3 is to anneal the wafer W. Step ST4 is to etch the thin film. In some embodiments, the sequence may include step ST1 to be implemented prior to step ST2. Step ST1 is to form a liner layer.

Figure 3:
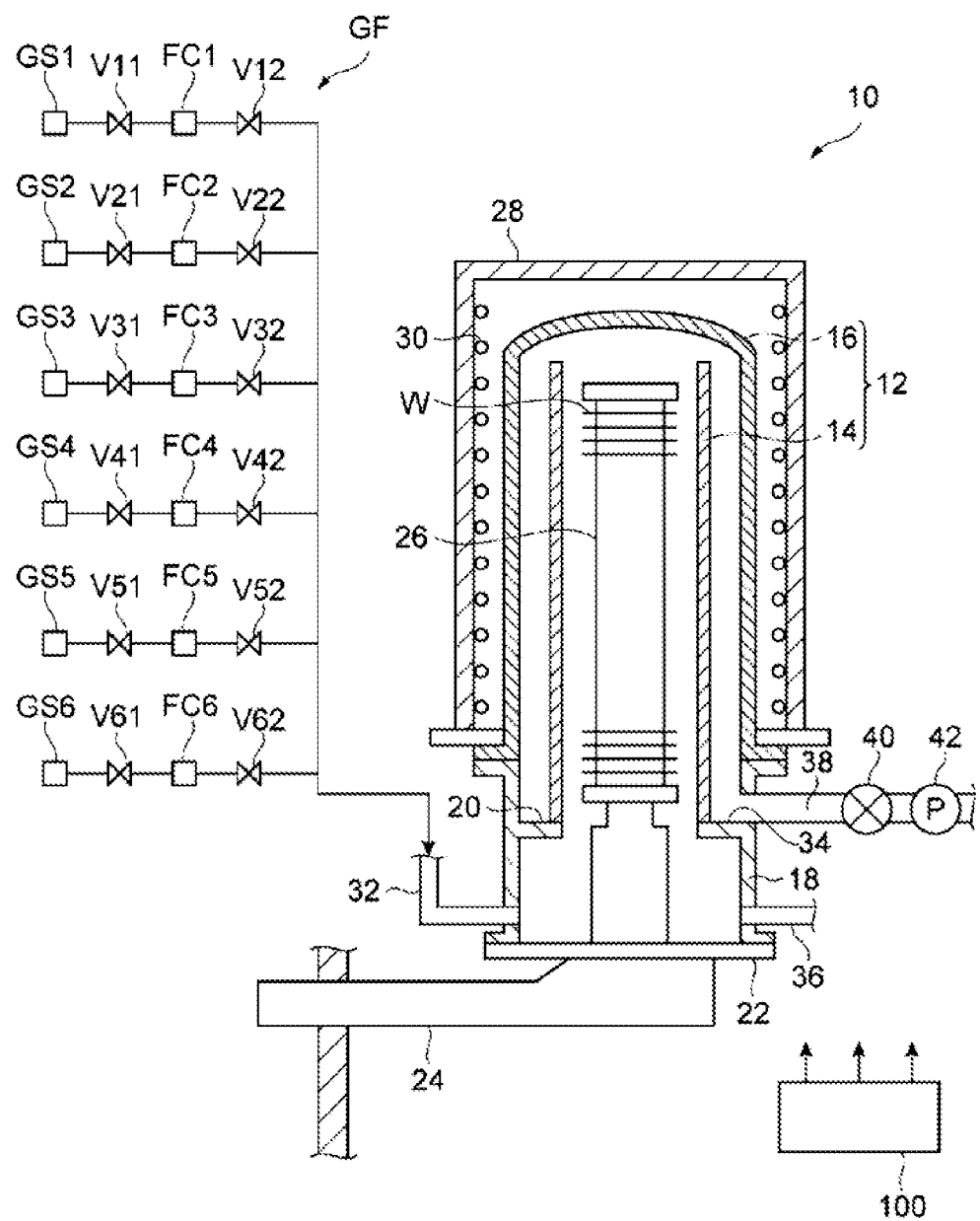
FIG. 3 is an illustrative view schematically showing a processing apparatus that can be used in implementing the process of FIG. 1, according to some embodiments.

A description will now be provided for one example of a processing apparatus that can be used in implementing steps ST1 to ST4. FIG. 3 is an illustrative view schematically showing the processing apparatus that can be used in implementing the process according to some embodiments. The processing apparatus shown in FIG. 3 can be used in implementing steps ST1 to ST4. In some embodiments, steps ST1 to ST4 may be implemented by other processing apparatuses.

The processing apparatus 10 shown in FIG. 3 includes a vessel 12. The vessel 12 is a reaction tube having a substantially cylindrical shape. The longitudinal direction of the vessel 12 is oriented in a vertical direction. The vessel 12 has a double tube structure and includes an inner tube 14 and an outer tube 16. The inner tube 14 and the outer tube 16 are made of a material superior in heat resistance and corrosion resistance, e.g., quartz.

The inner tube 14 has a substantially cylindrical shape with an upper end and a lower end. The upper and lower ends of the inner tube 14 are opened. The outer tube 16 is installed in a substantially coaxial relationship with the inner tube 14 so as to cover the inner tube 14. There is a pre-specified gap between the inner tube 14 and the outer tube 16. An upper end of the outer tube 16 is closed and a lower end of the outer tube 16 is opened.

A manifold 18 is installed below the outer tube 16. The manifold 18 is formed in a tubular shape and may be made of, e.g., stainless steel (SUS). The manifold 18 is air-tightly connected to the lower end of the outer tube 16. In the manifold 18, a support ring 20 is formed to protrude inward from the inner wall of the manifold 18. The support ring 20 supports the inner tube 14.

A lid 22 is installed below the manifold 18. The lid 22 is connected to a boat elevator 24 and can be moved up and down by the boat elevator 24. If the lid 22 is moved up by the boat elevator 24, a lower opening (namely, a throat portion) of the manifold 18 is closed. On the other hand, if the lid 22 is moved down by the boat elevator 24, the lower opening (namely, a throat portion) of the manifold 18 is opened.

A wafer boat 26 is mounted on the lid 22. The wafer boat 26 may be made of, e.g., quartz. The wafer boat 26 is configured to hold a plurality of wafers W with a pre-specified gap between respective wafers in the vertical direction.

A heat insulating body 28 is installed around the vessel 12 so as to surround the vessel 12. Heaters (or heating units) 30 are installed on the inner wall surface of the heat insulating body 28. The heaters 30 are composed of, e.g., resistance heating elements. The interior of the vessel 12 is heated to a specified temperature by the heaters 30. Thus, the wafers W are heated to a predetermined temperature.

At least one gas introduction pipe 32 is connected to the sidewall of the manifold 18. For example, the gas introduction pipe 32 is connected to the sidewall of the manifold 18 at a position lower than the support ring 20. A gas line formed by the gas introduction pipe 32 communicates with the interior of the vessel 12.

A gas supply unit GF is connected to the gas introduction pipe 32. In some embodiments, the gas supply unit GF includes gas sources GS1, GS2, GS3, GS4, GS5 and GS6, valves V11, V12, V21, V22, V31, V32, V41, V42, V51, V52, V61 and V62, and flow rate controllers FC1, FC2, FC3, FC4, FC5 and FC6 such as mass flow controllers or the like. The gas source GS1 is connected to the gas introduction pipe 32 through the valve V11, the flow rate controller FC1 and the valve V12. The gas source GS2 is connected to the gas introduction pipe 32 through the valve V21, the flow rate controller FC2 and the valve V22. The gas source GS3 is connected to the gas introduction pipe 32 through the valve V31, the flow rate controller FC3 and the valve V32. The gas source GS4 is connected to the gas introduction pipe 32 through the valve V41, the flow rate controller FC4 and the valve V42. The gas source GS5 is connected to the gas introduction pipe 32 through the valve V51, the flow rate controller FC5 and the valve V52. The gas source GS6 is connected to the gas introduction pipe 32 through the valve V61, the flow rate controller FC6 and the valve V62.

The gas source GS1 is a source for supplying a raw material gas used in forming a seed layer at step ST1. The gas source GS1 may supply, e.g., an aminosilane-based gas. Examples of the aminosilane-based gas may include BAS (butylaminosilane), BTBAS (bis(tertiary-butylamino) silane), DMAS (dimethylaminosilane), BDMAS (bis(dimethylamino)silane), TDMAS (tri(dimethylamino)silane), DEAS (diethylaminosilane), BDEAS (bis(diethylamino)silane), DPAS (dipropylaminosilane), or DIPAS (diisopropylaminosilane). Furthermore, an aminodisilane gas may be used as the aminosilane-based gas. In some embodiments, examples of the aminosilane-based gas may include diisopropylaminodisilane $(Si_2H_5N(iPr)_2)$, diisopropylaminotrisilane $(Si_3H_7N(iPr)_2)$, diisopropylaminodichlorosilane $(Si_2H_4ClN(iPr)_2)$, or diisopropylaminotrichlorosilane $(Si_3H_6ClN(iPr)_2)$. Moreover, the gas source GS1 may be a source of a high-order silane gas such as a disilane gas, a trisilane gas, a tetrasilane gas.

The gas source GS2 is a source of a raw material gas that can be used in forming an amorphous semiconductor layer of a liner layer at step ST1 as will be described later. Furthermore, the gas source GS2 is a source of a raw material gas that can be used in forming a thin film at step ST2. If the amorphous semiconductor layer formed at step ST1 and the thin film formed at step ST2 are composed of silicon, the gas source GS2 may be a source of a monosilane gas, a disilane gas or the aforementioned aminosilane-based gas. If the amorphous semiconductor layer formed at step ST1 and the thin film formed at step ST2 are composed of germanium, the gas source GS2 may be a source of a germane-containing gas such as a monogermane. If the amorphous semiconductor layer formed at step ST1 and the thin film formed at step ST2 are composed of silicon germanium, the gas source GS2 may be a source of a germane-containing gas mixed with a monosilane gas, a disilane gas or an aminosilane-based gas. In addition, the amorphous semiconductor layer formed at step ST1 and the thin film formed at step ST2 may be respectively formed by using different gases supplied from separate gas sources.

The gas source GS3 is a source of an impurity raw material gas that can be used at step ST1 and/or step ST2. Examples of the impurity may include arsenic (As), boron (B), or phosphorus (P). Examples of the impurity raw material gas may include phosphine $(PH_3)$, diborane $(B_2H_6)$, boron trichloride $(BCl_3)$, or arsine $(AsH_3)$.

The gas source GS4 is a source of an additional gas that can be used in forming an amorphous semiconductor layer at step ST1 and/or in forming a thin film at step ST2. Examples of the additional gas may include a $C_2H_4$ gas, a $N_2O$ gas, a NO gas or a $NH_3$ gas. In some embodiments, one or more of the $C_2H_4$ gas, the $N_2O$ gas, the NO gas and the $NH_3$ gas may be used as the additional gas.

The gas source GS5 is a source of an inert gas that can be used in the annealing implemented at step ST3. Examples of the inert gas may include a hydrogen gas or a nitrogen gas.

The gas source GS6 is a source of an etching gas that can be used in the etching implemented at step ST4. As the etching gas, it is possible to use a gas containing one or more of $Cl_2$, HCl, $F_2$, $Br_2$ and HBr. An arbitrary gas may be used as the etching gas as long as it can selectively etch the thin film with respect to the epitaxial region and the insulating film IS.

As shown in FIG. 3, an exhaust port 34 through which a gas existing within the vessel 12 is exhausted, is formed in the side surface of the manifold 18. The exhaust port 34 is arranged above the support ring 20 and is in communication with the space formed between the inner tube 14 and the outer tube 16 of the vessel 12. Accordingly, an exhaust gas generated within the inner tube 14 flows toward the exhaust port 34 through the space formed between the inner tube 14 and the outer tube 16.

Further, a purge gas supply pipe 36 is connected to the manifold 18. The purge gas supply pipe 36 is connected to the manifold 18 below the exhaust port 34. The purge gas supply pipe 36 is connected to a purge gas supply source (not shown). A purge gas, e.g., nitrogen gas, is supplied from the purge gas supply source into the vessel 12 through the purge gas supply pipe 36.

An exhaust pipe 38 is air-tightly connected to the exhaust port 34. From the upstream side of the exhaust pipe 38, a valve 40 and an exhaust unit 42 such as a vacuum pump are installed in the exhaust pipe 38. The valve 40 adjusts an opening degree of the exhaust pipe 38, thereby controlling an internal pressure of the vessel 12 at a predetermined pressure. The exhaust unit 42 discharges a gas from the vessel 12 through the exhaust pipe 38 and adjusts the internal pressure of the vessel 12. In some embodiments, a trap, a scrubber, and so forth may be installed in the exhaust pipe 38, and the processing apparatus 10 may be configured to detoxify the exhaust gas discharged from the vessel 12 before the exhaust gas is exhausted out of the processing apparatus 10.

Figure 4:
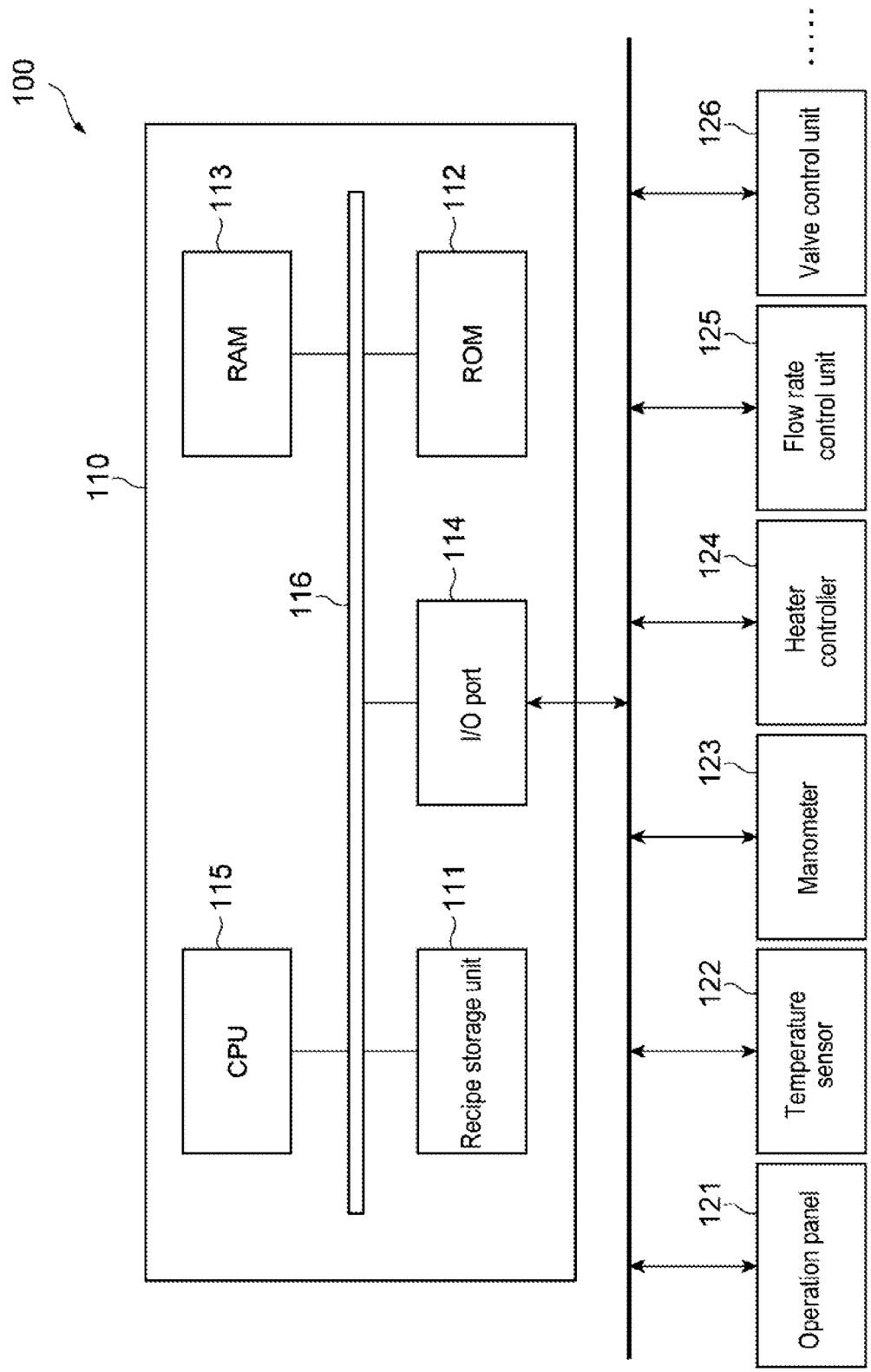
FIG. 4 is an illustrative view showing a configuration of a control unit of the processing apparatus shown in FIG. 3.

The processing apparatus 10 further includes a control unit 100 configured to control individual units or parts of the processing apparatus 10. FIG. 4 shows the configuration of the control unit 100. As shown in FIG. 4, the control unit 100 includes a main control unit 110. An operation panel 121, a temperature sensor (group) 122, a manometer (group) 123, a heater controller 124, a flow rate control unit 125, a valve control unit 126, and so forth are connected to the main control unit 110.

The operation panel 121 includes a display screen and operation buttons and delivers an operator's operation instruction to the main control unit 110. Further, the operation panel 121 allows the display screen to display various types of information transmitted from the main control unit 110.

The temperature sensor (group) 122 measures internal temperatures of the vessel 12, the gas introduction pipe 32, the exhaust pipe 38 and the like, and notifies the measured temperature values to the main control unit 110. The manometer (group) 123 measures internal pressures of the vessel 12, the gas introduction pipe 32, the exhaust pipe 38 and the like, and notifies the measured pressure values to the main control unit 110.

The heater controller 124 is configured to individually control the heaters 30. In response to the instruction transmitted from the main control unit 110, the heater controller 124 supplies electric power to the heaters 30, thereby causing the heaters 30 to generate heat. Moreover, the heater controller 124 individually measures power consumption of the heaters 30 and notifies the measured power consumption to the main control unit 110.

The flow rate control unit 125 controls the flow rate controllers FC1 to FC6 of the gas supply unit GF such that the flow rates of the gases flowing through the gas introduction pipe 32 become equal to the flow rates instructed by the main control unit 110. Moreover, the flow rate control unit 125 measures flow rates of the gases actually flowing through the gas introduction pipe 32 and reports the measured flow rate values to the main control unit 110. The valve control unit 126 controls opening degrees of the valves arranged in the respective pipes according to the values instructed by the main control unit 110.

The main control unit 110 includes a recipe storage unit 111, a ROM 112, a RAM 113, an I/O port 114, a CPU 115, and a bus 116 which interconnects the recipe storage unit 111, the ROM 112, the RAM 113, the I/O port 114 and the CPU 115.

A setup recipe and a plurality of process recipes are stored in the recipe storage unit 111. The recipe storage unit 111 only stores the setup recipe when the processing apparatus 10 is initially manufactured. The setup recipe is executed to generate a thermal model or the like corresponding to different processing apparatuses. The process recipes are prepared for each individual process which is actually performed pursuant to the user's desire. For example, the process recipes define a variation in temperature in the respective areas, a variation in the internal pressure of the vessel 12, the start and stop timing for supplying the processing gas, the supply amount of the processing gas, and the like from the time at which the wafers W are loaded into the vessel 12 to the time at which the processed wafers W are unloaded from the vessel 12.

The ROM 112 is formed of an EEPROM, a flash memory, a hard disk or the like. The ROM 112 is a storage medium for storing an operation program of the CPU 115. The RAM 113 serves as a work area or the like of the CPU 115.

The I/O port 114 is connected to the operation panel 121, the temperature sensor (group) 122, the manometer (group) 123, the heater controller 124, the flow rate control unit 125 and the valve control unit 126 and the like. The I/O port 114 controls the input and output of data or signals.

The CPU (Central Processing Unit) 115 is the core of the main control unit 110 and executes the control program stored in the ROM 112. In response to the instructions transmitted from the operation panel 121, the CPU 115 controls the operation of the processing apparatus 10 depending on the recipes (process recipes) stored in the recipe storage unit 111. The CPU 115 controls the temperature sensor (group) 122, the manometer (group) 123, the flow rate control unit 125, and the like to respectively measure the temperatures, the pressures and the flow rates, and the like within the vessel 12, the gas introduction pipe 32 and the exhaust pipe 38. Based on the measured data, the CPU 115 outputs control signals and the like to the heater controller 124, the flow rate control unit 125, the valve control unit 126 and the like and controls the respective units or parts pursuant to the process recipes. The bus 116 transmits information between the respective units or parts.

Hereinafter, the process according to FIG. 1, which can be implemented by the processing apparatus 10 configured as above, will be described in more detail with reference back to FIGS. 1 and 2A to 2F.

Figure 2D:
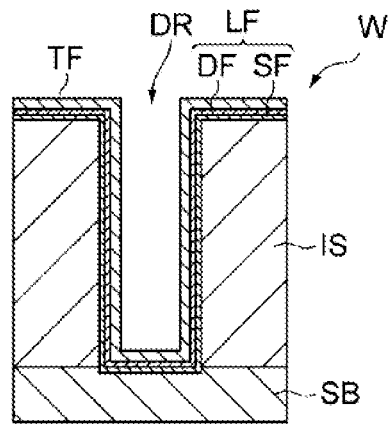
Figure 2B:
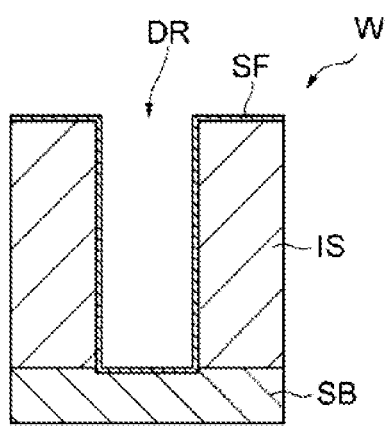
Figure 2E:
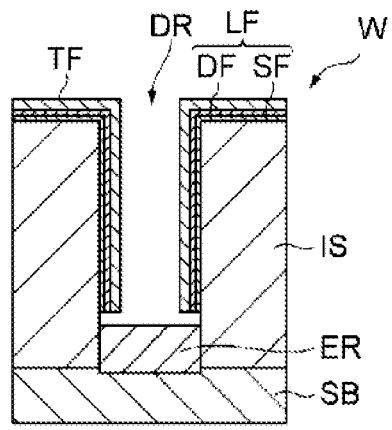
Figure 2C:
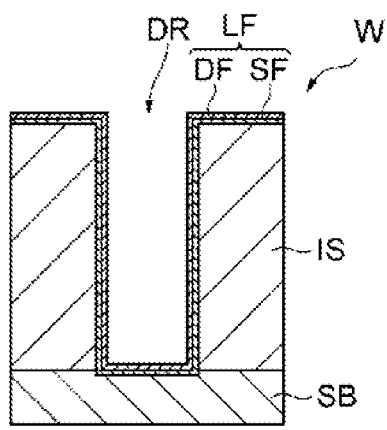

At step ST1, as shown in FIGS. 1, 2B and 2C, a liner layer LF is formed. More specifically, as shown in FIG. 2B, a seed layer SF is formed on a wall surface that defines a depression DR. The seed layer SF is formed into a thickness of, e.g., 0.1 nm, so as not to occlude the depression DR. The wall surface on which the seed layer SF is formed includes side wall surfaces SW that define the depression DR at the lateral sides and a bottom surface BW that defines the depression DR at the lower side. At step ST1, the seed layer SF is also formed on a top surface TW of an insulating film IS.

At step ST1, in order to form the seed layer SF, a raw material gas such as an aminosilane-based gas or a high-order silane gas is supplied at a predetermined flow rate into the vessel 12 in which the wafers W are accommodated. The internal pressure and internal temperature of the vessel 12 are set to predetermined values, respectively. In some embodiments, at step ST1, the predetermined flow rate of the raw material gas may be set to fall within a predetermined range of, e.g., from 10 sccm to 500 sccm. Further, the internal pressure of the vessel 12 may be set to fall within a predetermined range of, e.g., from 0.1 Torr (13.33 Pa) to 10 Torr (1333 Pa). Further, the internal temperature of the vessel 12 may be set to fall within a predetermined range of, e.g., from 300 degrees C. to 600 degrees C.

When implementing the formation of the seed layer SF at step ST1 with the processing apparatus 10, the control unit 100 performs a control operation (a fifth control operation) to be described below. In this control operation, the control unit 100 controls the valve V11, the flow rate controller FC1 and the valve V12 so that the raw material gas can be supplied from the gas source GS1 is supplied into the vessel 12 at a specified flow rate. Further, the control unit 100 controls the exhaust unit 42 so that the internal pressure of the vessel 12 becomes equal to a predetermined pressure. Moreover, the control unit 100 controls the heaters 30 so that the internal temperature of the vessel 12 becomes equal to a predetermined temperature.

The seed layer SF is formed as a single layer by the aminosilane-based gas or the high-order silane gas but is not limited thereto. For example, the seed layer SF may be formed by forming a first silicon-containing layer through the adsorption or deposition of the aminosilane-based gas and then forming a second silicon-containing layer on the first silicon-containing layer through the use of the high-order silane gas.

Subsequently, at step ST1 and as shown in FIG. 2C, an amorphous semiconductor layer DF containing an impurity is formed. The amorphous semiconductor layer DF may be, e.g., a silicon layer, a germanium layer or a silicon germanium layer which is kept in an amorphous state. The amorphous semiconductor layer DF is formed along the side wall surfaces SW, the bottom surface BW and the top surface TW. The amorphous semiconductor layer DF is formed into a thickness of, e.g., from 0.5 nm to 10 nm, so as not to occlude the depression DR. While the amorphous semiconductor layer DF is formed on the seed layer SF in FIG. 2C, the amorphous semiconductor layer DF may be directly formed on the side wall surfaces SW, the bottom surface BW and the top surface TW.

The amorphous semiconductor layer DF contains an impurity as set forth above. The term "impurity" refers to an atom that is bonded to Si to generate an electron or a positive hole. For example, the impurity may be an atom such as B, P or As. In order to form the amorphous semiconductor layer DF containing the impurity, a third gas is supplied into the vessel 12 which accommodates the wafers W in forming the amorphous semiconductor layer DF at step ST1. More specifically, a raw material gas of semiconductor material is supplied into the vessel 12 at a predetermined flow rate and an impurity raw material gas is supplied into the vessel 12 at a predetermined flow rate. During the formation of the amorphous semiconductor layer DF at step ST1, the internal pressure of the vessel 12 is set at a predetermined pressure and the internal temperature of the vessel 12 is set at a predetermined temperature. The raw material gas supplied at step ST1 to form the amorphous semiconductor layer DF may be, e.g., a monosilane gas, a disilane gas or the aforementioned aminosilane-based gas. The raw material gas may be a germane-containing gas. The raw material gas may be a germane-containing gas mixed with a monosilane gas, a disilane gas or the aforementioned aminosilane-based gas. The raw material gas is supplied into the vessel 12 at a flow rate of, e.g., from 50 sccm to 5000 sccm. The impurity raw material gas may be, e.g., phosphine ($PH_3$), diborane ($B_2H_6$), boron trichloride ($BCl_3$), or arsine ($AsH_3$). The impurity raw material gas is supplied into the vessel 12 at a flow rate of, e.g., from 1 sccm to 1000 sccm. At step ST1, in order to form the amorphous semiconductor layer DF, the internal pressure of the vessel 12 is set at a pressure of, e.g., from 0.1 Torr (13.33 Pa) to 10 Torr (1333 Pa). The internal temperature of the vessel 12 is set at a temperature of, e.g., from 300 degrees C. to 600 degrees C.

At step ST1, in order to form the amorphous semiconductor layer DF, an additional gas including one or more of a $C_2H_4$ gas, a $N_2O$ gas, a NO gas and a $NH_3$ gas may be supplied into the vessel 12. A flow rate of the additional gas may be set at, e.g., from 5 sccm to 1000 sccm.

When implementing the formation of the amorphous semiconductor layer DF at step ST1 with the processing apparatus 10, the control unit 100 performs a control operation (a fourth control operation) to be described below. In this control operation, the control unit 100 controls the valve V21, the flow rate controller FC2 and the valve V22 so that the raw material gas can be supplied from the gas source GS2 into the vessel 12 at a specified flow rate. Further, the control unit 100 controls the valve V31, the flow rate controller FC3 and the valve V32 so that a raw material gas of impurity can be supplied from the gas source GS3 into the vessel 12 at a specified flow rate. Further, the control unit 100 controls the exhaust unit 42 to set the internal pressure of the vessel 12 at a predetermined pressure. Further, the control unit 100 controls the heaters 30 to set the internal temperature of the vessel 12 at a predetermined temperature. Further, if an additional gas is used to form the amorphous semiconductor layer DF at step ST1, the control unit 100 controls the valve V41, the flow rate controller FC4 and the valve V42 so that the raw material gas can be supplied from the gas source GS4 into the vessel 12 at a specified flow rate.

Subsequently, step ST2 of the process shown in FIG. 1 is performed. At step ST2 and as shown in FIG. 2D, a thin film TF is formed. The thin film TF is formed along the wall surfaces, which define the depression DR, so as not to occlude the depression DR. For example, the thin film TF is formed along the side wall surfaces SW, the bottom surface BW and the top surface TW. In some embodiments, the thin film TF is formed on the amorphous semiconductor layer DF. In other embodiments, however, the thin film TF may be directly formed on the side wall surfaces SW, the bottom surface BW and the top surface TW. The thickness of the thin film TF is set at a thickness of, e.g., 12.5 nm. In some embodiments, the thin film TF may contain an impurity. The impurity contained in the thin film TF may be the same as the impurity contained in the amorphous semiconductor layer DF. The concentration of the impurity contained in the amorphous semiconductor layer DF is set higher than the concentration of the impurity contained in the thin film TF.

At step ST2, in order to form the thin film TF, a first gas is supplied into the vessel 12 which accommodates the wafers W. Specifically, a raw material gas of semiconductor material may be supplied into the vessel 12 at a specified flow rate. At step ST2, the internal pressure and the internal temperature of the vessel 12 are set at predetermined values, respectively. Examples of the raw material gas supplied at step ST3 may include, e.g., a monosilane gas, a disilane gas or the aforementioned aminosilane-based gas. The raw material gas may be a germane-containing gas. The raw material gas may be a germane-containing gas mixed with a monosilane gas, a disilane gas or the aforementioned aminosilane-based gas. The raw material gas is supplied into the vessel 12 at a flow rate of, e.g., from 50 sccm to 5000 sccm. At step ST2, the internal pressure of the vessel 12 is set at a pressure of, e.g., from 0.1 Torr (13.33 Pa) to 10 Torr (1333 Pa). The internal temperature of the vessel 12 is set at a temperature of, e.g., from 300 degrees C. to 700 degrees C. When the monosilane gas is used as the raw material gas, the internal temperature of the vessel 12 is set at, e.g., 530 degrees C. When the disilane gas is used as the raw material gas, the internal temperature of the vessel 12 is set at, e.g., 400 degrees C.

In some embodiments, an step ST2, an additional gas containing one or more of a $C_2H_4$ gas, a $N_2O$ gas, a NO gas and a $NH_3$ gas may be supplied into the vessel 12. A flow rate of the additional gas may be set at, e.g., 5 sccm to 1000 sccm.

When implementing step ST2 in the processing apparatus 10, the control unit 100 executes a control operation (a first control operation) to be described below. In this control operation, the control unit 100 controls the valve V21, the flow rate controller FC2 and the valve V22 so that the raw material gas can be supplied from the gas source GS2 into the vessel 12 at a specified flow rate. The control unit 100 controls the exhaust unit 42 so as to set the internal pressure of the vessel 12 at a predetermined pressure. The control unit 100 controls the heaters 30 so as to set the internal temperature of the vessel 12 at a predetermined temperature. When the impurity is contained in the thin film TF, the control unit 100 controls the valve V31, the flow rate controller FC3 and the valve V32 so that an impurity raw material gas can be supplied from the gas source GS3 into the vessel 12 at a specified flow rate. When the additional gas is used at step ST2, the control unit 100 controls the valve V41, the flow rate controller FC4 and the valve V42 so that the additional gas can be supplied from the gas source GS4 into the vessel 12 at a specified flow rate.

Subsequently, in the process shown in FIG. 1, step ST3 is implemented. At step ST3, the wafers W are annealed. Further at step ST3, a semiconductor material that makes up the portion of the thin film TF formed in the bottom of the depression DR is melt to flow toward the bottom of the depression DR. As shown in FIG. 2E, the melted semiconductor material forms an epitaxial region ER having a crystal structure similar to the crystal structure of the substrate SB. If a liner layer LF is formed as a base of the thin film TF, at step ST3, a semiconductor material that makes up the portion of the liner layer LF formed in the bottom of the depression DR is melt to flow toward the bottom of the depression DR. The semiconductor material forms an epitaxial region ER.

At step ST3, the internal temperature of the vessel 12 that accommodates the wafers W is set at a predetermined temperature. For example, the internal temperature of the vessel 12 is set at a temperature of from 300 degrees C. to 600 degrees C. For example, the internal temperature of the vessel 12 is set at 550 degrees C. At step ST3, the internal pressure of the vessel 12 is set at a predetermined pressure. For example, the internal pressure of the vessel 12 at step ST3 may be set to fall within a range of from $1\times10^{-10}$ Torr ($1.333\times10^{-7}$ Pa) to 1 Torr (133.3 Pa). In some embodiments, the internal pressure of the vessel 12 is set at $1\times10^{-6}$ Torr ($1.333\times10^{-3}$ Pa). At step ST3, the wafers W are annealed for, e.g., about five hours. Further, at step ST3, an inert gas such as a hydrogen gas or a nitrogen gas may be supplied into the vessel 12.

When implementing step ST3 in the processing apparatus 10, the control unit 100 executes a control operation (a second control operation) to be described below. In this control operation, the control unit 100 controls the exhaust unit 42 so as to set the internal pressure of the vessel 12 at a predetermined pressure. The control unit 100 controls the heaters 30 so that the internal temperature of the vessel 12 can be set at a predetermined temperature. When using an inert gas, the control unit 100 controls the valve V51, the flow rate controller FC5 and the valve V52 so that the inert gas can be supplied from the gas source GS5 into the vessel 12 at a specified flow rate.

Figure 2F:
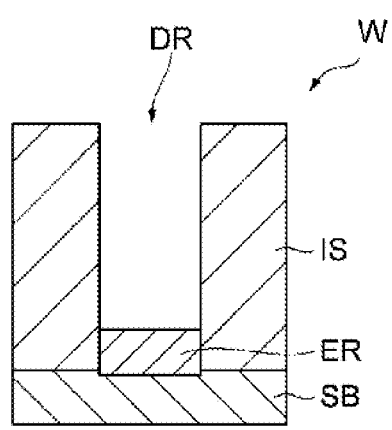

Subsequently, in the process according to FIG. 1, step ST4 is implemented. At step ST4, a residual portion of the thin film TF left without forming the epitaxial region ER at step ST3 is etched. At step ST4, a second gas is supplied at a specified flow rate into the vessel 12 that accommodates the wafers W. The second gas may contain one or more of $Cl_2$, HCl, $F_2$, $Br_2$ and HBr. The flow rate of the second gas may be, e.g., from 10 sccm to 5000 sccm. At step ST4, the internal pressure of the vessel 12 is set at a predetermined pressure and the internal temperature of the vessel 12 is set at a predetermined temperature, respectively. The internal pressure of the vessel 12 at step ST4 may be set to fall within a range of, e.g., from $1\times10^{-10}$ Torr ($1.333\times10^{-7}$ Pa) to 100 Torr ($133.3\times10^{2}$ Pa). The internal temperature of the vessel 12 at step ST4 is set to fall within a range of, e.g., from 200 degrees C. to 700 degrees C. In some embodiments, the internal pressure and the internal temperature of the vessel 12 at step ST4 may be set at $4\times10^{-2}$ Torr (5.333 Pa) and 550 degrees C. An etching rate of the thin film TF by the second gas is higher than the etching rate of the epitaxial region ER. Accordingly, as a result of step ST4 and as shown in FIG. 2F, the thin film TF can be removed while leaving the epitaxial region ER. In a case where there is formed a liner layer LF, the liner layer LF is also removed at step ST4.

When implementing step ST4 in the processing apparatus 10, the control unit 100 executes a control operation (a third control operation) to be described below. In this control operation, the control unit 100 controls the valve V61, the flow rate controller FC6 and the valve V62 so that the second gas can be supplied from the gas source GS6 into the vessel 12 at a specified flow rate. The control unit 100 controls the exhaust unit 42 so as to set the internal pressure of the vessel 12 at a predetermined pressure. The control unit 100 controls the heaters 30 so that the internal temperature of the vessel 12 can be set at a predetermined temperature.

Subsequently, in the process according to FIG. 1, a determination is made at step ST5 as to whether the sequence including steps ST1 to ST4 is a final sequence. If the final sequence is finished, the process according to FIG. 1 comes to an end. If the final sequence is not finished, the sequence including steps ST1 to ST4 is repeated. In some embodiments, the sequence may be implemented only once. In some embodiments, the annealing of step ST3 may be omitted in the second and subsequent sequences. That is to say, after one sequence including steps ST1 to ST4 is finished, the raw material gas is supplied at step ST2. This makes it possible to deposit a semiconductor material on the epitaxial region ER having a crystal structure similar to the crystal structure of the epitaxial region ER. The thin film TF which is formed concurrently with the deposition of the semiconductor material can be removed by the etching step ST4. In some embodiments, the depression DR need not be fully filled with the epitaxial region ER. The depression DR may be filled with the epitaxial region ER up to a depth-direction intermediate portion of the depression DR. The remaining portion of the depression DR may be filled with a metallic material.

In the process according to FIG. 1, as described above, a portion of the thin film TF is moved toward the bottom of the depression DR by virtue of annealing, thereby forming the epitaxial region ER. The residual portion of the thin film TF is etched away. Thus, in the process according to FIG. 1, the depression DR can be filled with the epitaxial region ER such that cavities are not generated. Further, in the process according to FIG. 1, the depression DR is filled with the epitaxial region having a crystal structure similar to the crystal structure of the substrate SB. It is therefore possible to reduce a contact resistance between the substrate SB and the material that fills the depression DR.

In one embodiment, the thin film TF can be caused to grow at a low temperature by forming the thin film TF that contains an impurity. It is therefore possible to reduce a thermal hysteresis applied to the wafers W and to reduce a stress generated in the thin film TF. Accordingly, it is possible to suppress, during the annealing of step ST3, agglomeration of the semiconductor material that makes up the thin film TF. It is also possible to cause the semiconductor material to flow toward the bottom of the depression DR.

In one embodiment, the amorphous semiconductor layer DF is formed between the wall surfaces, which define the depression DR, and the thin film TF. Thus, a stress difference between the thin film TF and the base thereof is alleviated. Further, the amorphous semiconductor layer DF containing a large amount of impurity is superior in surface flatness. Since the amorphous semiconductor layer DF contains an impurity, it is possible to suppress crystallization of the semiconductor material within the amorphous semiconductor layer DF. Moreover, the amorphous semiconductor layer DF that contains an impurity can grow at a low temperature. Accordingly, it is possible to reduce a thermal hysteresis applied to the wafers W and to reduce a stress generated in the amorphous semiconductor layer DF. Therefore, during the annealing of step ST3, it is possible to suppress the agglomeration of the semiconductor material generated in the amorphous semiconductor layer DF. As a result, it becomes possible to suppress the generation of cavities.

In one embodiment, the seed layer SF is formed at step ST1. The formation of the seed layer SF makes it possible to reduce surface energy of an interface between the seed layer SF and the amorphous semiconductor layer DF. This further increases the flatness of the amorphous semiconductor layer DF.

In one embodiment, in at least one of steps ST1 and ST2, a $N_2O$ gas or an ethylene gas is further supplied into the vessel 12. According to this embodiment, it is possible to suppress crystallization of the semiconductor material and to reduce a grain size.

While different embodiments have been described above, the present disclosure is not limited to the aforementioned embodiments but may be differently modified. For example, in the aforementioned embodiments, the substrate SB is a monocrystalline silicon substrate or a polycrystalline silicon substrate and the thin film TF is an amorphous semiconductor film. In a modified example, the substrate SB may be a monocrystalline silicon substrate and the thin film TF may be a polycrystalline semiconductor film.

As set forth above, according to the depression filling process of the present disclosure, semiconductor material that makes up a portion of a thin film is moved toward a bottom of a depression by virtue of annealing, thereby forming an epitaxial region having a crystal structure similar to the crystal structure of the semiconductor substrate. Since an etching rate of the epitaxial region is lower than the etching rate of a remaining portion of the thin film, the thin film is removed, and the epitaxial region is left in the depression during the etching. Therefore, since the depression may be filled with the epitaxial region thus left, it is possible to suppress generation of cavities.

Further, in some embodiments of the present disclosure, the thin film may contain an impurity. The thin film containing the impurity may be caused to grow at a low temperature. Thus, it is possible to reduce a thermal hysteresis applied to a workpiece and reduce a stress generated in the thin film. Accordingly, it is possible to suppress, during the annealing, agglomeration of the semiconductor material that makes up the thin film, and also possible to cause the semiconductor material to flow toward the bottom of the depression.

Further, the process of FIG. 1 may, in some embodiments, further include forming a liner layer prior to forming the thin film, when the thin film is an amorphous semiconductor film. The liner layer includes an amorphous semiconductor layer containing an impurity, and the thin film is formed on the amorphous semiconductor layer. Thus, a stress difference between the thin film and the base thereof is alleviated. Further, the amorphous semiconductor layer containing the impurity has a relatively flat surface. Further, since the amorphous semiconductor layer of the liner layer contains the impurity, crystallization of the semiconductor material in the amorphous semiconductor layer may be suppressed. Further, the amorphous semiconductor layer containing the impurity may be caused to grow at a low temperature, as compared with a polycrystalline semiconductor layer. Thus, it is possible to reduce a thermal hysteresis applied to the workpiece and reduce a stress generated in the amorphous semiconductor layer. Accordingly, it is possible to cause the semiconductor material to flow toward the bottom of the depression, while further suppressing agglomeration of the semiconductor material that makes up the thin film.

Further, in some embodiments, the amorphous semiconductor layer of the liner layer is an amorphous silicon layer. The liner layer may further include a seed layer formed by an aminosilane-based gas or a high-order silane gas. The seed layer is formed on a wall surface which defines the depression. The amorphous silicon layer of the liner layer is formed on the seed layer. The formation of the seed layer makes it possible to reduce surface energy of an interface between the amorphous silicon layer of the liner layer and the base thereof, thus further increasing a flatness of the amorphous silicon layer of the liner layer.

Further, in some embodiments, the thin film may contain an impurity. The amorphous semiconductor of the liner layer is higher in impurity concentration than the thin film. Accordingly, it is possible to suppress agglomeration of the semiconductor material that makes up the thin film, and also possible to cause the semiconductor material to flow toward the bottom of the depression.

As described above, according to various aspects and embodiments, it is possible to suppress generation of cavities when filling the depression.

While certain embodiments have been described, these embodiments have been presented by way of example only, and are not intended to limit the scope of the present disclosure. Indeed, the embodiments described herein may be embodied in a variety of other forms. Furthermore, various omissions, substitutions and changes in the form of the embodiments described herein may be made without depart-

What is claimed is:

1. A depression filling method for filling a depression of a workpiece including a semiconductor substrate and an insulating film formed on the semiconductor substrate, the depression penetrating the insulating film so as to extend to the semiconductor substrate, the method comprising:
   forming a thin film of a semiconductor material along a wall surface of the depression;
   annealing the workpiece at a temperature from 300 to 600 degrees C. and at a total pressure from $1 \times 10^{-10}$ Torr to 1 Torr, to cause the semiconductor material of the thin film to move toward a bottom of the depression and to form an epitaxial region corresponding to crystals of the semiconductor substrate; and
   etching the thin film after annealing the workpiece,
   wherein an etching rate of the epitaxial region is lower than an etching rate of a remaining portion of the thin film, and
   wherein a sequence, which includes forming the thin film, annealing the workpiece, and etching the thin film, is repeated.

2. The method of claim 1, wherein the thin film is an amorphous semiconductor film and the semiconductor substrate is a monocrystalline semiconductor substrate or a polycrystalline semiconductor substrate.

3. The method of claim 2, wherein the thin film contains an impurity.

4. The method of claim 2, further comprising:
   forming a liner layer prior to forming the thin film,
   wherein the liner layer includes an amorphous semiconductor layer, which contains a first impurity, and
   wherein the thin film is formed on the amorphous semiconductor layer.

5. The method of claim 4, wherein the amorphous semiconductor layer is an amorphous silicon layer,
   wherein the liner layer further includes a seed layer formed by an aminosilane-based gas or a high-order silane gas, the seed layer being formed on the wall surface, and
   wherein the amorphous silicon layer is formed on the seed layer.

6. A depression filling method for filling a depression of a workpiece including a semiconductor substrate and an insulating film formed on the semiconductor substrate, the depression penetrating the insulating film so as to extend to the semiconductor substrate, the method comprising:
   forming a thin film of a semiconductor material along a wall surface of the depression;
   annealing the workpiece at a temperature from 300 to 600 degrees C. and at a total pressure from $1 \times 10^{-10}$ Torr to 1 Torr, to cause the semiconductor material of the thin film to move toward a bottom of the depression and to form an epitaxial region corresponding to crystals of the semiconductor substrate; and
   etching the thin film after annealing the workpiece,
   wherein an etching rate of the epitaxial region is lower than an etching rate of a remaining portion of the thin film,
   wherein the thin film is an amorphous semiconductor film and the semiconductor substrate is a monocrystalline semiconductor substrate or a polycrystalline semiconductor substrate,
   wherein the method further comprising forming a liner layer prior to forming the thin film,
   wherein the liner layer includes an amorphous semiconductor layer, which contains a first impurity,
   wherein the thin film is formed on the amorphous semiconductor layer, and
   wherein the thin film contains a second impurity and the first impurity of the amorphous semiconductor layer is higher in impurity concentration than the second impurity of the thin film.

* * * * *